US008973437B2

(12) United States Patent
Cantolino

(10) Patent No.: US 8,973,437 B2
(45) Date of Patent: Mar. 10, 2015

(54) CONDENSATE SENSING DEVICE

(71) Applicant: Christopher Cantolino, Bradenton, FL (US)

(72) Inventor: Christopher Cantolino, Bradenton, FL (US)

(73) Assignee: Resource Conservation Technologies, Inc., Sarasota, FL (US)

( * ) Notice: Subject to any disclaimer, the term of this patent is extended or adjusted under 35 U.S.C. 154(b) by 259 days.

(21) Appl. No.: 13/573,568

(22) Filed: Sep. 25, 2012

(65) Prior Publication Data
US 2014/0083182 A1     Mar. 27, 2014

(51) Int. Cl.
*G01F 23/00*     (2006.01)
*H05K 13/00*     (2006.01)

(52) U.S. Cl.
CPC ............. *G01F 23/00* (2013.01); *H05K 13/00* (2013.01)
USPC ........................................ 73/304 R; 116/227

(58) Field of Classification Search
USPC ................... 73/304 R, 304 C; 116/109, 227
See application file for complete search history.

(56) References Cited

U.S. PATENT DOCUMENTS

| 5,965,814 | A  | * | 10/1999 | French et al. ............... 73/304 R |
| 6,658,844 | B1 | * | 12/2003 | Lammers ....................... 116/227 |
| 8,065,913 | B2 | * | 11/2011 | McCracken et al. ........ 73/304 R |
| 8,572,991 | B2 | * | 11/2013 | Arensmeier ............... 73/304 R |
| 2002/0108440 | A1 | * | 8/2002 | Colman et al. ............ 73/304 R |
| 2009/0090179 | A1 | * | 4/2009 | Carmona et al. ............ 73/304 R |
| 2013/0256161 | A1 | * | 10/2013 | Crary et al. ................... 116/227 |

* cited by examiner

*Primary Examiner* — G. Bradley Bennett
(74) *Attorney, Agent, or Firm* — Arthur W. Fisher, III

(57) ABSTRACT

A condensate sensing device to generate a condensate signal when condensate within a condensate collector reaches a predetermined level comprising a hollow shell and overmold integrally formed to form a water tight enclosure to operatively house a signal generator including electronic components to selectively generate the condensate signal when the condensate within the predetermined level reaches the predetermined level to control the operation of equipment and/or energize an alarm.

30 Claims, 6 Drawing Sheets

CONDENSATE SENSING DEVICE

BACKGROUND OF THE INVENTION

1. Field of the Invention

A condensate sensing device and a method of manufacturing the condensate sensing device.

2. Description of the Prior Art

Sensors to monitor liquid levels are well known in the art. Such sensors often include a float member which rises and falls with the changing liquid level in a drain pipe, drain pan or tank. Float actuated switches are commonly used in equipment and systems to prevent overflow of liquid such as condensate in air conditioning and refrigeration systems.

Often such float sensors and switches have been replaced by more reliable electronic probe switch devices. These devices eliminate moving parts generally using instead, a pair of probe sensors for detecting rising water levels.

Further efforts have been undertaken to produce module structures to encapsulate electronic components on circuit boards to protect the components from the surrounding environment are represented by the patent documents discussed below.

US 2002/0189346 relates to a device for sensing a level of a fluid including a microcontroller disposed within a housing and a probe coupled to the microcontroller. The microcontroller applies a given DC potential to the probe for a first period of time, measures a voltage associated with the level of the fluid to be sensed after the first period of time and applies a reference DC potential to the probe for a second period of time.

US 2003/0173707 shows the use of polyamide based molding compositions for the production of moldings and for adhesive sealing or filling in the production of electrical or electronic devices, in particular of plugs, cables, switches, sensors, transponders and modules.

US 2006/0003137 discloses a method of encapsulating a component assembly comprising a first layer having a first set of physical properties and a second layer having a second set of physical properties to protectively surround the component assembly. A continuous transitory material is formed between the first layer and the second layer at associated first and second margin portions such that the first layer and the second layer are not prone to delamination.

US 2006/0171127 describes a control unit including a plurality of electronic parts sealed with a resin.

US 2006/0208915 discloses a liquid level control switch comprising a plurality of electronic components enclosed in a case including electrically conductive sensor-probe pins extend from a PC board and are positioned for detecting liquids at various levels within drains, drain pans, tanks, reservoirs and pipes of various dimensions.

US 2008/0179962 relates to a leak detector pad comprising a circuit board having a bottom surface and a top surface, spaced first and second electrically conductive traces located on the bottom surface, and an electronic circuit mounted on the top surface.

US 2009/0140866 shows a sensor for detecting the presence of a liquid comprising a housing having a concave upper surface, a concave lower surface, and a peripheral wall connecting the upper surface and the lower surface. A plurality of apertures are formed in the wall. A plurality of electrically conductive members extend above the upper surface and below the lower surface and are separated from one another by a gap in which a liquid can accumulate. The electrically conductive members are configured to generate an output signal when a conductive liquid comes into contact with the electrically conductive members and bridges the gap. An output connector is coupled to the plurality of electrically conductive members and is configured to carry the output signal.

US 2009/0268414 teaches an over-molded electronic module includes a frame, an electronic assembly and a polymeric body. The frame includes a sidewall that defines an opening to provide a position for the electronic assembly. The polymeric body is formed of a polymeric composition encapsulating both sides of the electronic assembly and a portion of the frame.

US 2009/0291288 relates to a molded part for bonding to metal or plastic substrates for use as a fastening element comprising a hot melt adhesive based on polyamide, polyolefins, polyesters, polyacrylates or polystyrene.

US 2009/0295027 discloses electrical components mounted on a circuit board sealed within a frame tray of a curable material that encapsulates the circuit board. The electrical components of the circuit board are positioned and sealed within the frame tray such that the cured material does not affect an airflow path which dissipates heat produced by the electrical components during use. The curing of the curable material shields the circuit board from moisture, dust and other environmental contaminates.

US 2010/0050756 shows a drain pan level monitoring system comprising a level sensor to generate a level sensor output signal related to a sensed level of condensation buildup within a drain pan.

SUMMARY OF THE INVENTION

The present invention relates to a condensate sensing device to generate a condensate signal when condensate within a condensate collector reaches a predetermined level.

The condensate sensing device comprises a hollow shell and an overmold integrally formed to form a water tight enclosure to operatively house a signal generator to generate the condensate signal when the condensate within the condensate collector reaches the predetermined level.

The hollow shell comprises a base having a plurality of chambers to receive and house corresponding electronic components mounted to a printed circuit board. Pins or protrusions extend downwardly from the hollow shell to engage the printed circuit board of the signal generator and form a permanent bond therebetween during the manufacturing or assembly process as described hereinafter.

Anchors extend outwardly from the periphery of the base to secure the hollow shell and the overmold together during the manufacturing or assembly process.

An expansive groove or channel is formed around the upper periphery of the hollow shell to allow for expansion and retraction thereof when the condensate sensing device is exposed to significant changes in temperature to maintain the water tight integrity of the interface between the hollow sleeve and the overmold to protect the signal generator from moisture.

A plurality of holes are formed through the printed circuit board to receive a corresponding pin or protrusion of the hollow shell therethrough to align the signal generator and components with the hollow shell and form a permanent bond during the manufacture or assembly process.

The signal generator is coupled to an HVAC unit by the cable or conductor, remote alarm or other device to be activated, energized or deactivated when the condensate signal is transmitted or received when the condensate within the condensate collector reaches the predetermined level.

The overmold comprises a body of macromelt material including a probe recess formed in the bottom surface thereof to receive at least a portion of the condensate level sensor pins or probes.

The probe recess includes condensate channel surfaces to channel or direct the flow of through and from the condensate sensing device.

The method or process of assembly and manufacture of the condensate sensing device comprises the steps of:
placing the hollow shell inverted into a mold
aligning the holes of the signal generator while inverted with the corresponding pins or protrusions formed on the hollow shell
placing the signal generator into the hollow shell by inserting the pins or protrusions into the corresponding holes
bonding the hollow shell and the signal generator together by sonic welding the pins or protrusions in the corresponding holes
forming (molding) the overmold to the hollow shell and the signal generator anchoring the hollow shell to the overmold by the anchors
removing the hollow shell, signal generator and overmold from the mold.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the nature and object of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

The present invention relates to a condensate sensing device to generate a condensate signal when condensate within a condensate collector such as a drain pan of a HVAC unit (not shown) reaches a predetermined level.

Figure 1:
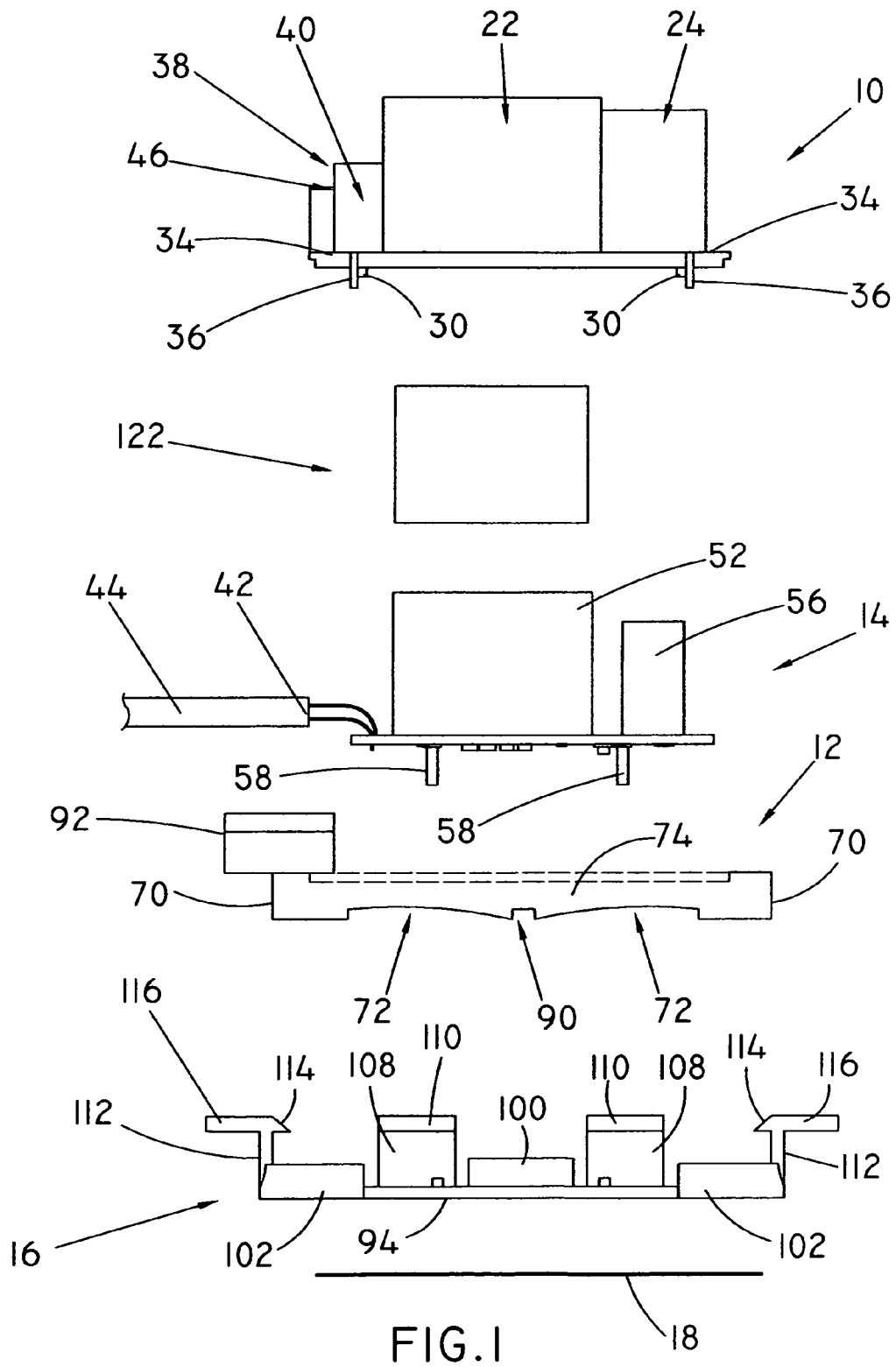
FIG. 1 is an exploded side view of the condensate sensing device of the present invention.
Figure 2:
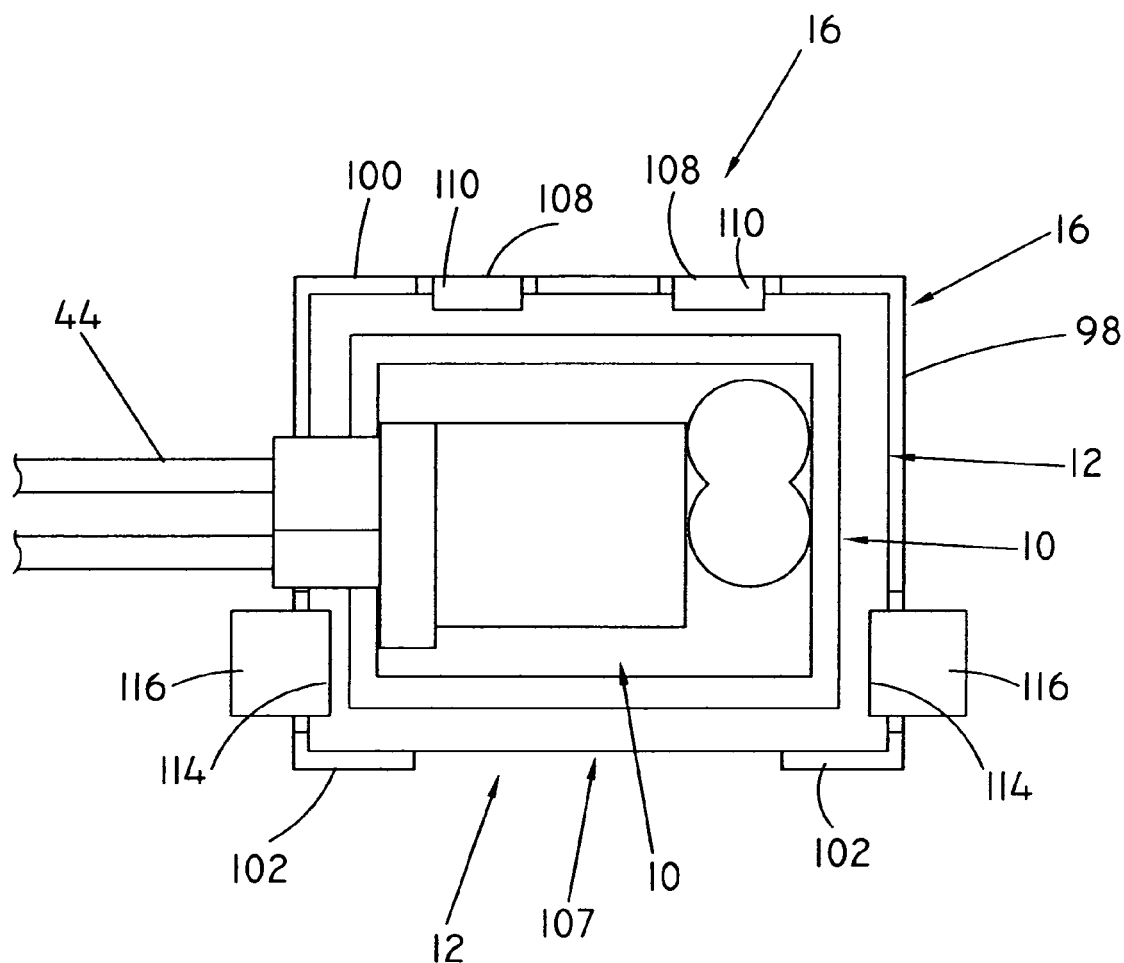
FIG. 2 is a top view of the condensate sensing device of the present invention.

As shown in FIGS. 1 and 2, the condensate sensing device comprises a hollow shell generally indicated as 10 and an overmold generally indicated as 12 integrally formed to form a water tight enclosure to operatively house a signal generator generally indicated as 14 to selectively generate the condensate signal when the condensate within the condensate collector (not shown) reaches the predetermined level. In addition, the condensate sensing device may further include a mounting base generally indicated as 16 to mount the condensate sensing device to the condensate collector (not shown) with a strip of double side tape 18 or other fastener described hereinafter.

Figure 3:
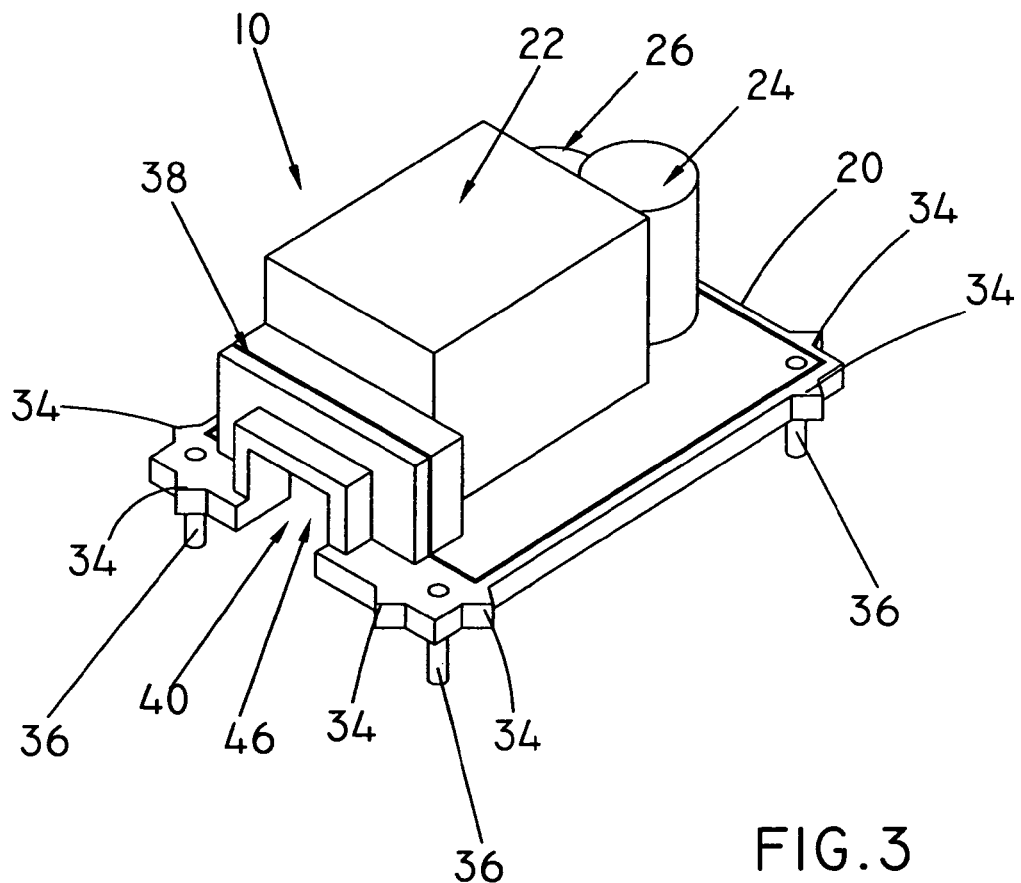
FIG. 3 is a perspective view of the hollow shell of the condensate sensing device of the present invention.
Figure 4:
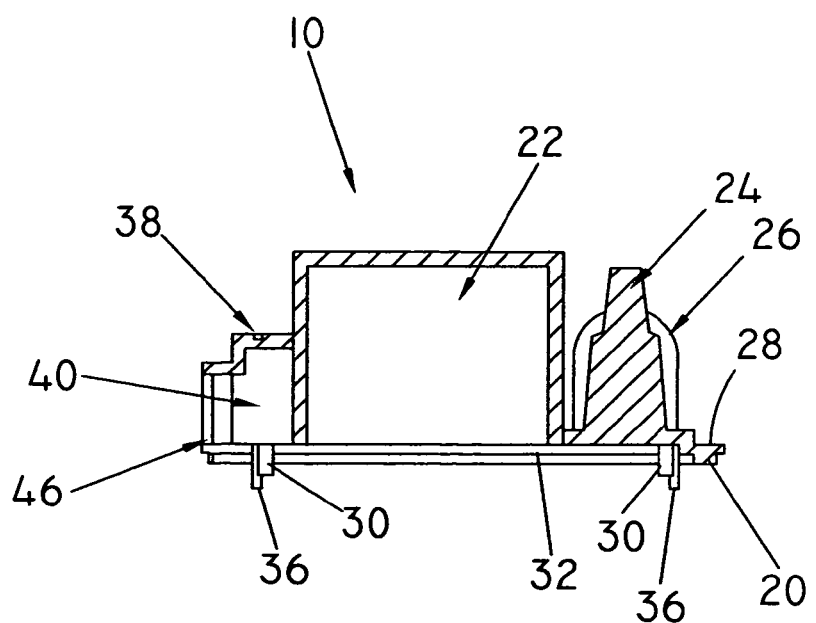
FIG. 4 is a cross-sectional side view of the hollow shell of the condensate sensing device of the present invention.

As best shown in FIGS. 3 and 4, the hollow shell 10 comprises a generally flat base 20 of high viscosity polycarbonate having a plurality of chambers such as a control device chamber 22, a condenser chamber 24 and a lamp chamber 26 extending upwardly from the top or upper surface 28 thereof to receive and house the corresponding component described hereinafter extending upwardly from the signal generator 14; while, a pin or protrusion 30 extends downwardly from each corner of the bottom or lower surface 32 thereof to align the hollow shell 10 and the signal generator 14 and form a permanent bond therebetween during assembly.

A pair of substantially triangularly shaped or pointed alignment spacers or anchors each indicated as 34 extends outwardly from each side of the generally flat base 10 to secure the sides of the hollow shell 10 and the overmold 12 together in spaced relationship relative to each other during the manufacturing or assembly process. In addition, a pair of projections or pin-like spacers or anchors each indicated as 36 project downward from opposite sides of the generally flat base 20 to anchor the hollow shell 10 to the bottom of the overmold 12 in spaced relationship relative to each other during the manufacturing or assembly process as described hereinafter.

An expansive groove or channel 38 is formed around the upper periphery of the hollow shell 10 to allow for expansion and retraction thereof when the condensate sensing device is exposed to significant changes in temperature to maintain the water tight integrity of the interface between the hollow sleeve 10 and the overmold 12 to protect the signal generator 14 from moisture.

The plurality of chambers may further include a cable interface chamber 40 to receive the inner end or connection portion 42 of a cable or conductor 44 extending through a cable opening 46 formed in the hollow shell 10 and held in place by the overmold 12 molded into the cable interface chamber 40 during the manufacturing or assembly process.

Figure 5:
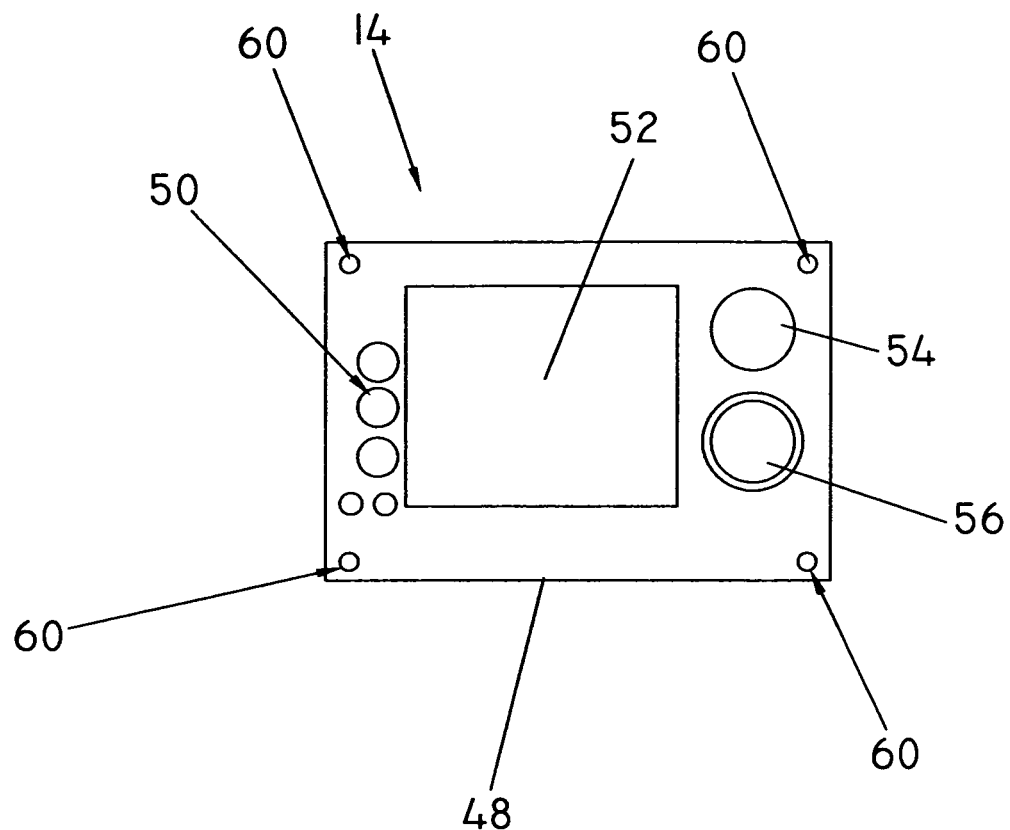
FIG. 5 is a top view of the signal generator of the condensate sensing device of the present invention.
Figure 6:
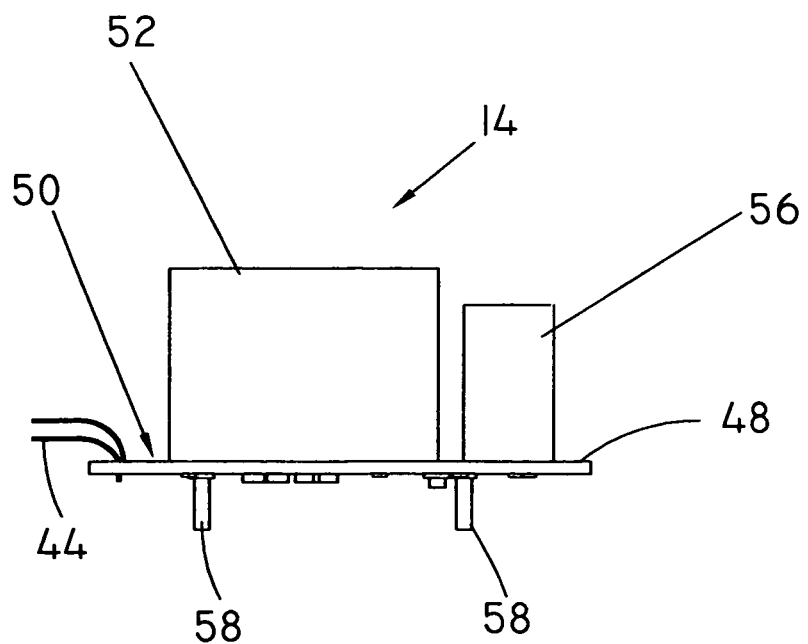
FIG. 6 is a side view of the signal generator of the condensate sensing device of the present invention.

As best shown in FIGS. 5 and 6, the signal generator 14 comprises printed circuit board 48 to support a plurality of electronic components generally indicated as 50 coupled to the conductor or cable 44 and a control device such as a switch or relay 52. A lamp or visual indicator 54 and a condenser 56 coupled to the electronic components 50 extend upward from the printed circuit board 48; while, a pair of condensate level sensor pins or members each indicated as 58 coupled to the electronic components extend downward from the printed circuit board 48 to generate the condensate signal and illuminate the lamp or visual indicator 54 when condensate reaches the predetermined level within the drain pan or condensate collector (not shown).

As described hereinafter, a hole 60 is formed through each corner of the printed circuit board 48 to receive a corresponding pin or protrusion 30 of the hollow shell 10 therethrough to align the signal generator 14 and components with the hollow shell 10 and form a permanent bond during the manufacture or assembly process. The signal generator 14 is coupled to an HVAC unit by the cable or conductor 44, remote alarm or other device (not shown) by the cable or conductor 44 to be activated, energized or deactivated when the condensate signal is transmitted or received when the condensate within the condensate collector (not shown) reaches the predetermined level.

Figure 7:
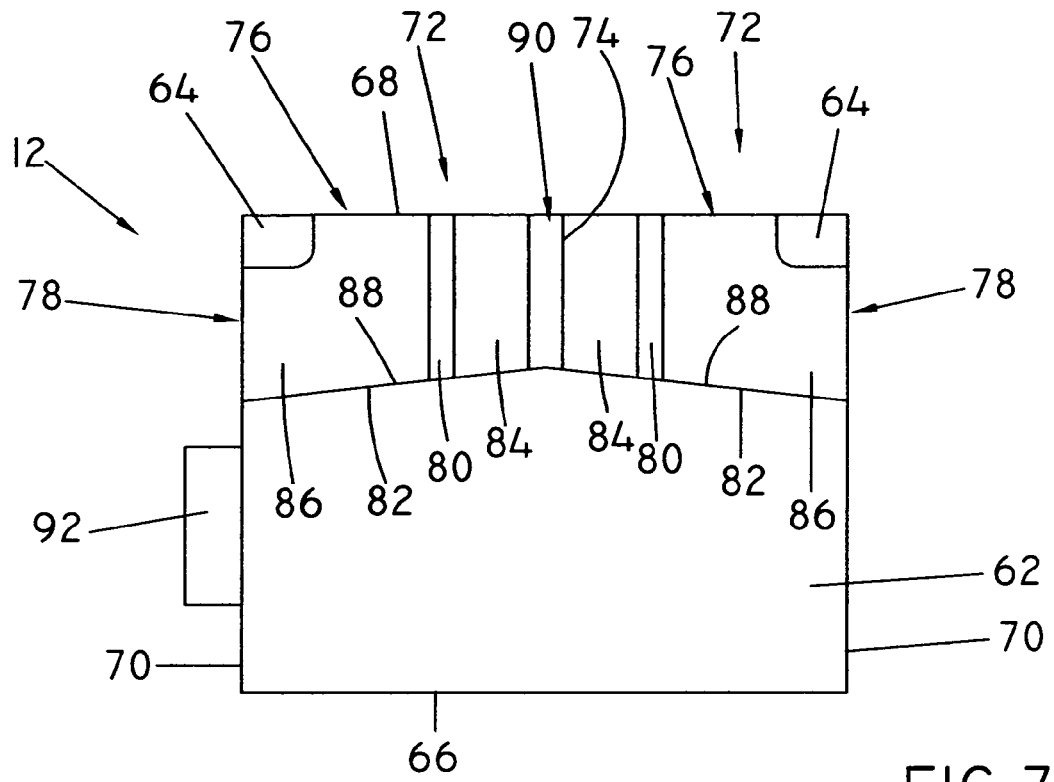
FIG. 7 is a bottom view of the overmold of the condensate sensing device of the present invention.
Figure 8:
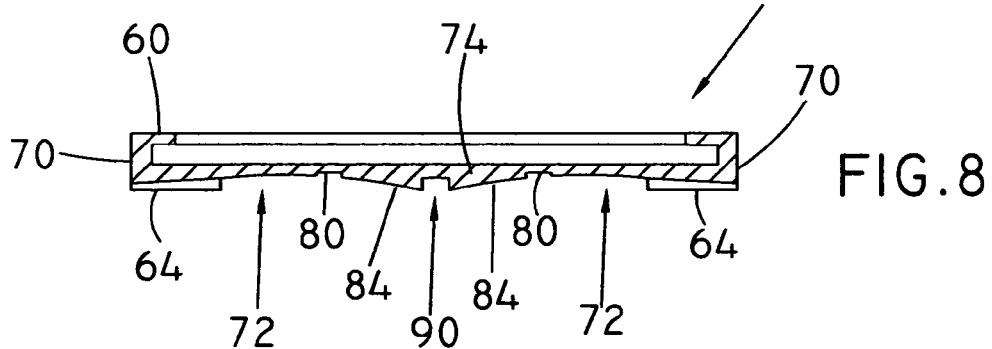
FIG. 8 is a cross-sectional end view of the overmold of the condensate sensing device of the present invention.
Figure 9:
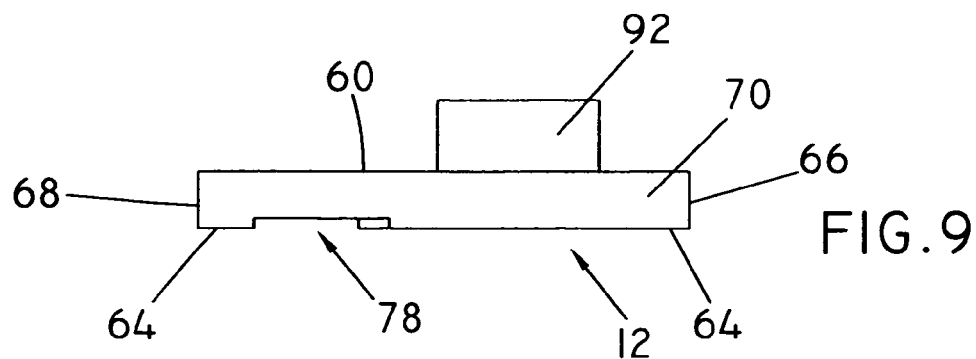
FIG. 9 is a side view of the overmold of the condensate sensing device of the present invention.

As best shown in FIGS. 7 through 9, the overmold 12 comprises a substantially rectangular body of macromelt material including a generally flat top surface 61, a generally flat bottom surface with a rear support portion 62 and a pair of forward support portions each indicated as 64, a rear wall 66, a front wall 68 and a pair of side walls each indicated as 70. A probe recess comprising a probe pin sector 72 disposed on each side of a partition 74 having at least a portion of a corresponding condensate level sensor pin or member 58 disposed therein is formed on the forward portion of the generally flat bottom surface to the front wall 68 forming a corresponding front condensate channel 76 in the front wall 68 and a side condensate channel 78 formed in each side wall 70.

Each probe pin sector 72 includes a condensate channel surface comprising a centrally disposed substantially flat surface 80 extending from a rear sector recess wall 82 of the probe recess to the front condensate channel 76, an inner channeling surface 84 extending from the partition 74 to the centrally disposed, substantially flat surface 80, and an outer channeling surface 86 extending from the corresponding side condensate channel 78 and the centrally disposed substantially flat surface 80. Each inner channeling surface 84 and each outer channeling surface 86 extend downwardly to the centrally disposed, substantially flat surface 80 to channel or direct condensate to each front condensate channel 76 when the condensate sensing device is horizontally disposed or positioned. In addition, the rear sector recess wall 82 comprises a diagonally disposed surface 88 extending from the corresponding side condensate channel 78 to a channeling groove 90 formed in the partition 74 to channel or direct condensate to each front condensate channel 76 when the condensate sensing device is vertically disposed or positioned.

A cable retaining block 92 fills the cable interface chamber 40 when the condensate sensing device is manufactured or assembled.

Figure 10:
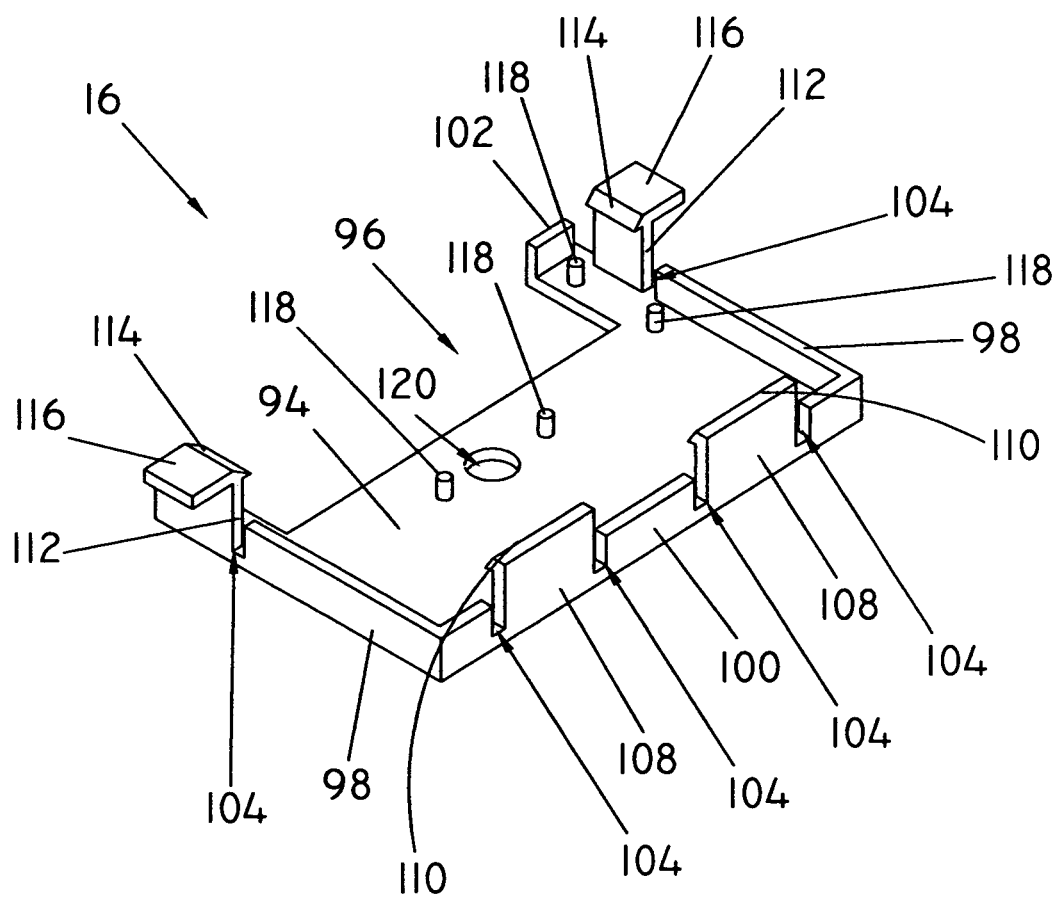
FIG. 10 is a perspective view of the mounting base of the condensate sensing device of the present invention.

As best shown in FIG. 10, the mounting base 16 comprises a substantially flat bottom 94 of flexible malleable material including a probe cutout 96 in the front portion thereof having a peripheral wall including a pair of side peripheral walls each indicated as 98, a rear peripheral wall 100 and a front peripheral wall comprising two sections each indicated as 102 formed around the peripheral edge thereof.

The side peripheral walls 98 and rear peripheral wall 100 have grooves or slots each indicated as 104 formed therein to make the mounting base 16 more flexible. A condensate outlet opening 107 is formed between the two sections 102 of the front peripheral wall 102.

A pair of rear flexible retaining members each indicated as 108 is formed on the rear peripheral wall 100 each terminating in a lip or retaining element 110 to engage the upper surface of the overmold 12 when the condensate sensing device is assembled. Similarly, a pair of flexible side retaining members each indicated as 112 is formed on opposite peripheral side walls 98 each terminating in a lip or retaining element 114 to engage the upper surface of the overmold 12 when the condensate sensing device is assembled. The retaining elements 110 of the rear flexible retaining members 108 and the retaining elements 114 of the side retaining member 112 cooperatively secure the mounting base 16 to the hollow shell 10 and overmold 12. A finger tab 116 is formed on the upper portion of each side retaining member 112 to facilitate separation of the mounting base 16 from the hollow shell 10 and overmold 12.

A plurality of risers or support posts each indicated as 118 extend upward or outward from the substantially flat bottom 94 to support the overmold body 12 in spaced relationship thereto.

The mounting base 16 may be secured to the bottom or side of the condensate collector (not shown) by a fastener (not shown) extending through a hole 120 formed through the substantially flat bottom 94 or by the strip of double side tape 18 shown in FIG. 1.

As shown in FIG. 1, an information label or placard 122 may be placed between the hollow shell 10 and the control switch or relay 52 of the signal generator 14.

The method or process of assembly and manufacture of the condensate sensing device comprises the steps of:
placing the hollow shell 10 inverted into a mold
placing the information placard 122 on the control switch or relay 52 of the signal generator 14
attaching the inner end portion 42 of the cable 44 to the printed circuit board 48 of the signal generator 14
aligning the holes 60 at the corners of the printed circuit board 48 of the signal generator 14 while inverted with the components assembled thereon with the corresponding pins or protrusions 30 formed at the corners of the hollow shell 10
placing the signal generator 14 into the hollow shell 10 and the inner end portion 42 of the cable 44 in the cable opening 46 by inserting the pins or protrusions 30 into the corresponding holes 60
bonding the hollow shell 10 and the signal generator 14 together by sonic welding the pins or protrusions 30 in the corresponding holes 60
forming (molding) the overmold 12 to the hollow shell 10 and the signal generator 14 anchoring the hollow shell 10 to the overmold 12 by the substantially triangularly shaped or pointed anchors 34 into the sides, front and back of the overmold 12 and the projections or pin-like anchors 36 into the bottom of the overmold 12, and the inner end or connection portion 42 of the cable 44 and the cable interface chamber 40
removing the hollow shell 10, signal generator 14 and overmold 12 from the mold.

It will thus be seen that the objects set forth above, among those made apparent from the preceding description are efficiently attained and since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,

What is claimed is:

1. A condensate sensing device to generate a condensate signal when condensate within a condensate collector reaches a predetermined level comprising a hollow shell and overmold integrally formed to form a water tight enclosure to operatively house a signal generator including electronic components to selectively generate the condensate signal when the condensate within the predetermined level reaches the predetermined level to control the operation of equipment and/or energize an alarm.

2. The condensate sensing device of claim 1 wherein said hollow shell comprises a base having a plurality of component chambers extending from the upper surface of said base to receive and house a corresponding plurality of system components of said signal generator.

3. The condensate sensing device of claim 2 wherein at least one protrusion extends from said base of said hollow shell to align said hollow shell with a hole formed in said signal generator and to form a permanent bond therebetween.

4. The condensate sensing device of claim 3 wherein a pin or protrusion extends from each corner of said hollow shell and a hole is formed through each corner of said signal generator to receive a corresponding pin or protrusion of said hollow shell therethrough to align said plurality of system components of said signal generator and said plurality of component chambers of said hollow shell.

5. The condensate sensing device of claim 3 further including an anchor extending outwardly from each side of said base to secure said hollow shell and said sides of said overmold in spaced relationship relative to each other.

6. The condensate sensing device of claim 5 wherein said anchors comprise pointed anchors.

7. The condensate sensing device of claim 5 further including anchors extending downward from opposite sides of said flat base to secure said hollow shell to the bottom of said overmold in spaced relationship relative to each other.

8. The condensate sensing device of claim 7 wherein said anchors comprise projections.

9. The condensate sensing device of claim 2 wherein an expansion groove is formed around the upper periphery of said hollow shell to allow expansion and retraction of said hollow shell when said condensate sensing device is exposed to changes in temperature to maintain the water tight integrity between said hollow sleeve and said overmold to protect said signal generator from moisture.

10. The condensate sensing device of claim 2 wherein said overmold comprises a body including a top surface, a bottom surface with a rear support portion and a pair of forward support portions, a rear wall, a front wall and a pair of side walls, a probe recess comprising a probe pin sector is disposed on each side of a partition having at least a portion of a corresponding condensate level sensor pin or member disposed therein is formed on the forward portion of said bottom surface to said front wall forming a corresponding front condensate channel in said front wall 68 and a side condensate channel formed in each said side wall.

11. The condensate sensing device of claim 10 wherein each said probe pin sector includes a condensate channel surface comprising a centrally disposed surface extending from a rear sector recess wall of said probe recess to said front condensate channel, an inner channeling surface extending from said partition to said centrally disposed surface and an outer channeling surface extending from said corresponding side condensate channel and said centrally disposed surface.

12. The condensate sensing device of claim 11 wherein each said inner channeling surface and each said outer channeling surface extend downwardly to said centrally disposed surface to channel or direct condensate to each said front condensate channel when said condensate sensing device is horizontally disposed or positioned.

13. The condensate sensing device of claim 12 wherein said rear sector recess wall comprises a diagonally disposed surface extending from said corresponding side condensate channel to a channeling groove formed in said partition to channel or direct condensate to each said front condensate channel when said condensate sensing device is vertically disposed or positioned.

14. The condensate sensing device of claim 11 wherein said rear sector recess wall comprises a diagonally disposed surface extending from said corresponding side condensate channel to a channeling groove formed in said partition to channel or direct condensate to each said front condensate channel when said condensate sensing device is vertically disposed or positioned.

15. The condensate sensing device of claim 2 further including a mounting base to mount said condensate sensing device to the condensate collector.

16. The condensate sensing device of claim 15 wherein said mounting base comprises a flexible malleable material including a probe cutout in the front portion thereof having a peripheral wall including a pair of side peripheral walls, a rear peripheral wall and a front peripheral wall comprising two sections formed around the peripheral edge thereof.

17. The condensate sensing device of claim 16 wherein said side peripheral walls and said rear peripheral wall including slots formed therein to make the mounting base more flexible.

18. The condensate sensing device of claim 16 further including a condensate outlet opening formed between said two sections of said front peripheral wall.

19. The condensate sensing device of claim 16 further including a pair of rear flexible retaining members formed on said rear peripheral wall, each said rear flexible retaining member terminating in a lip or retaining element to engage said overmold.

20. The condensate sensing device of claim 19 further including a flexible side retaining member formed on opposite peripheral side walls each terminating in a lip or retaining element to engage said overmold.

21. The condensate sensing device of claim 20 further including a finger tab formed on the upper portion of each side retaining member to facilitate separation of said mounting base from said hollow shell and said overmold.

22. The condensate sensing device of claim 16 wherein a flexible side retaining member is formed on opposite peripheral side walls each terminating in a lip or retaining element to engage said overmold.

23. The condensate sensing device of claim 16 wherein a plurality of risers or support posts extend from said bottom to support said overmold in spaced relationship thereto.

24. A method of manufacturing and assembling a condensate sensing device capable of generating a condensate signal when condensate within a condensate collector reaches a predetermined level comprising a hollow shell and overmold integrally formed to form a water tight enclosure to operatively house a signal generator including electronic components to selectively generate the condensate signal when the condensate within the predetermined level reaches the predetermined level to control the operation of equipment and/or energize an alarm comprising the steps of:

placing a hollow shell inverted into a mold attaching the inner end portion of the cable to the printed circuit board of the signal generator aligning the holes at the corners of the printed circuit board of the signal generator while inverted with the components assembled thereon with the corresponding pins or protrusions formed at the corners of the hollow shell placing the signal generator into the hollow shell and the inner end portion of the cable in the cable opening by inserting the pins or protrusions into the corresponding holes bonding the hollow shell and the signal generator together by sonic welding the pins or protrusions in the corresponding holes forming the overmold to the hollow shell and the signal generator securing in spaced relationship the hollow shell relative to the overmold by anchors and removing the hollow shell, signal generator and overmold from the mold.

25. The condensate sensing device of claim 24 further including anchoring the hollow shell to the overmold with a plurality of anchors extending from the hollow shell.

26. The condensate sensing device of claim 25 wherein said anchors extend into the sides of the overmold.

27. The condensate sensing device of claim 26 wherein additional anchors extend into the bottom of the overmold.

28. The condensate sensing device of claim 25 wherein the anchors extend into the bottom of the overmold.

29. The condensate sensing device of claim 24 further including placing an information placard between the hollow shell and the signal generator.

30. The condensate sensing device of claim 3 further including spacers extending downward from opposite sides of said flat base to secure said hollow shell to the bottom of said overmold in spaced relationship relative to each other.

* * * * *